(12) United States Patent
Novack et al.

(10) Patent No.: US 7,879,688 B2
(45) Date of Patent: Feb. 1, 2011

(54) METHODS FOR MAKING ELECTRONIC DEVICES WITH A SOLUTION DEPOSITED GATE DIELECTRIC

(75) Inventors: James C. Novack, Hudson, WI (US); Dennis E. Vogel, Lake Elmo, MN (US); Brian K. Nelson, Shoreview, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 815 days.

(21) Appl. No.: 11/771,787

(22) Filed: Jun. 29, 2007

(65) Prior Publication Data

US 2009/0004771 A1   Jan. 1, 2009

(51) Int. Cl.
*H01L 21/4763* (2006.01)

(52) U.S. Cl. ............... 438/458; 438/216; 257/E51.007; 257/E21.625; 257/E21.629

(58) Field of Classification Search ........... 438/585
See application file for complete search history.

(56) References Cited

U.S. PATENT DOCUMENTS

| | | | |
|---|---|---|---|
| 4,262,072 A | | 4/1981 | Wendling et al. |
| 5,116,790 A | * | 5/1992 | Bruno et al. ............. 501/139 |
| 5,500,537 A | * | 3/1996 | Tsumura et al. ........... 257/40 |
| 5,739,254 A | | 4/1998 | Fuller et al. |
| 5,854,139 A | * | 12/1998 | Aratani et al. ............ 438/780 |
| 5,969,376 A | * | 10/1999 | Bao ........................ 257/40 |
| 6,150,191 A | * | 11/2000 | Bao ........................ 438/99 |
| 6,194,481 B1 | | 2/2001 | Furman et al. |
| 6,326,640 B1 | * | 12/2001 | Shi et al. .................. 257/40 |
| 6,331,356 B1 | * | 12/2001 | Angelopoulos et al. .. 428/411.1 |
| 6,335,539 B1 | * | 1/2002 | Dimitrakopoulos et al. ... 257/40 |
| 6,399,208 B1 | * | 6/2002 | Baum et al. .............. 428/446 |
| 6,521,677 B2 | | 2/2003 | Yashiro et al. |
| 6,569,707 B2 | * | 5/2003 | Dimitrakopoulos et al. ... 438/99 |
| 6,621,098 B1 | * | 9/2003 | Jackson et al. ............ 257/40 |
| 6,690,029 B1 | | 2/2004 | Anthony et al. |
| 6,747,287 B1 | * | 6/2004 | Toguchi et al. ........... 257/40 |
| 6,864,396 B2 | | 3/2005 | Smith et al. |
| 6,940,092 B2 | * | 9/2005 | Yoshida et al. ........... 257/40 |
| 6,974,877 B2 | | 12/2005 | Vogel et al. |
| 6,992,032 B2 | * | 1/2006 | McDaniel et al. .......... 502/87 |
| 6,998,068 B2 | | 2/2006 | Gerlach |

(Continued)

FOREIGN PATENT DOCUMENTS

JP   2008-044835   2/2008

(Continued)

OTHER PUBLICATIONS

Dielectric investigation of inorganic-organic hybrid film based on zirconium oxocluster-crosslinked PMMA, Schubert et al., Journal of Non-crystalline solids 322 (2003), 154-159).*

(Continued)

*Primary Examiner*—Fernando L Toledo
*Assistant Examiner*—Ankush k Singal
(74) *Attorney, Agent, or Firm*—Gregory D. Allen

(57) ABSTRACT

A method of making an electronic device comprises solution depositing a dielectric composition onto a substrate and polymerizing the dielectric composition to form a gate dielectric. The dielectric composition comprises a polymerizable resin and zirconium oxide nanoparticles.

18 Claims, 2 Drawing Sheets

U.S. PATENT DOCUMENTS

| | | | |
|---|---|---|---|
| 7,005,672 B2* | 2/2006 | Wu et al. | 257/40 |
| 7,037,583 B2 | 5/2006 | Furman et al. | |
| 7,052,772 B2 | 5/2006 | Lottes et al. | |
| 7,098,525 B2 | 8/2006 | Bai et al. | |
| 7,109,519 B2 | 9/2006 | Gerlach | |
| 7,122,063 B2 | 10/2006 | Naito et al. | |
| 7,151,275 B2* | 12/2006 | Klauk et al. | 257/40 |
| 7,189,663 B2* | 3/2007 | Bao et al. | 438/778 |
| 7,282,735 B2* | 10/2007 | Wu et al. | 257/40 |
| 7,364,940 B2* | 4/2008 | Kim et al. | 438/99 |
| 7,498,662 B2 | 3/2009 | Napierala | |
| 7,576,208 B2 | 8/2009 | Brown et al. | |
| 2003/0031438 A1* | 2/2003 | Kambe et al. | 385/122 |
| 2003/0077059 A1 | 4/2003 | Chien et al. | |
| 2005/0170192 A1* | 8/2005 | Kambe et al. | 428/447 |
| 2005/0266629 A1* | 12/2005 | Shim et al. | 438/197 |
| 2005/0287697 A1* | 12/2005 | Unno et al. | 438/99 |
| 2006/0027860 A1 | 2/2006 | Nomoto | |
| 2006/0057857 A1 | 3/2006 | Fleming et al. | |
| 2006/0060857 A1 | 3/2006 | Mardilovich et al. | |
| 2006/0065989 A1 | 3/2006 | Druffel et al. | |
| 2006/0113523 A1* | 6/2006 | Kubota et al. | 257/40 |
| 2006/0148950 A1 | 7/2006 | Davidson et al. | |
| 2006/0199886 A1 | 9/2006 | Ryang | |
| 2006/0214159 A1* | 9/2006 | Nakayama et al. | 257/40 |
| 2006/0214312 A1* | 9/2006 | Wu et al. | 257/787 |
| 2007/0012922 A1* | 1/2007 | Harada et al. | 257/66 |
| 2007/0014018 A1 | 1/2007 | Wheatley et al. | |
| 2007/0087131 A1* | 4/2007 | Hutchinson et al. | 427/533 |
| 2007/0096079 A1* | 5/2007 | Nakayama et al. | 257/40 |
| 2007/0099333 A1* | 5/2007 | Moriya | 438/96 |
| 2007/0112097 A1 | 5/2007 | Olson et al. | |
| 2007/0120111 A1* | 5/2007 | Nakamura et al. | 257/40 |
| 2007/0126002 A1* | 6/2007 | Moriya et al. | 257/40 |
| 2007/0135600 A1* | 6/2007 | Otomaru et al. | 526/179 |
| 2007/0137520 A1 | 6/2007 | Brown et al. | |
| 2007/0146426 A1 | 6/2007 | Nelson et al. | |
| 2007/0215957 A1 | 9/2007 | Chen et al. | |
| 2007/0259473 A1* | 11/2007 | Wu et al. | 438/82 |
| 2008/0067505 A1 | 3/2008 | Lee et al. | |
| 2008/0139766 A1* | 6/2008 | Kim et al. | 526/247 |
| 2008/0197414 A1* | 8/2008 | Hoffman et al. | 257/347 |
| 2008/0311308 A1 | 12/2008 | Lee et al. | |
| 2008/0312355 A1* | 12/2008 | Jung et al. | 522/107 |
| 2009/0001356 A1* | 1/2009 | Novack et al. | 257/40 |

FOREIGN PATENT DOCUMENTS

| | | |
|---|---|---|
| WO | WO 03/018645 A1 | 3/2003 |
| WO | WO 2005/055248 A2 | 6/2005 |
| WO | WO 2006/073856 A2 | 7/2006 |
| WO | WO 2006/098416 A1 | 9/2006 |
| WO | WO 2006/104068 A1 | 10/2006 |

OTHER PUBLICATIONS

Organically Modified Transistion Metal Alkoxides: Chemical Problems and Structural Issues on the Way to Materials Syntheses. Ulrich Schubert, May 23, 2007.*

A New type of Methacrylate-substituted oxozirconium clusters, Schubert et al., Monatshefte fur Chemie 132,993-999(2001).*

Swelling behaviour and thermal stability of poly(methylmethacrylate) crosslinked by the oxozirconium cluster, Schubert et al., Applied organometallic chemistry, 2001, 15; 401-406.*

Inorganic -organic hybrid materials from poly(methylmethacrylate) crosslinked by an organically modified oxozirconium cluster. synthesis and characterization, Schubert et al., polymers for advanced technologies, 2002.*

Sander et al., "Polycyclic Aromatic Hydrocarbon Structure Index", NIST Special Publication 922, (Dec. 1997), 10 pages, U.S. Government Printing Office.

U.S. Appl. No. 11/771,859, filed Jun. 29, 2007 entitled "Electronic Devices Having a Solution Deposited Gate Dielectric".

U.S. Appl. No. 11/771,859 Non-Final Office Action dated Mar. 9, 2009.

U.S. Appl. No. 11/771,859 Amendment and Response dated Jul. 9, 2009 (Response to Non-Final Office Action dated Mar. 9, 2009).

U.S. Appl. No. 11/771,859 Final Office Action dated Nov. 6, 2009.

U.S. Appl. No. 11/771,859 Amendment and Response dated Feb. 8, 2010 (Response to Final Office Action dated Nov. 6, 2009).

U.S. Appl. No. 11/771,859 Non-Final Office Action dated May 20, 2010.

Interview Summary dated Aug. 31, 2010 in U.S. Appl. No. 11/771,859.

Supplemental Response dated Sep. 23, 2010 in U.S. Appl. No. 11/771,859.

Office Action dated Dec. 8, 2010 in U.S. Appl. No. 11/771,859.

* cited by examiner

METHODS FOR MAKING ELECTRONIC DEVICES WITH A SOLUTION DEPOSITED GATE DIELECTRIC

FIELD

This invention relates to methods for making electronic devices with a solution deposited gate dielectric.

BACKGROUND

The printing of electronic devices such as, for example, thin film transistors (TFTs) has become of interest as a way to make electronic devices without incurring the costs associated with the equipment and processes traditionally used in the semiconductor industry. Ink jet printing can be particularly useful because it allows for discrete material placement.

One area of concern, however, in printed electronics is the performance of the semiconductor. The performance of the semiconductor depends upon charge carrier transport along the semiconductor molecules and facile transfer between the molecules. A more orderly arrangement of the molecules therefore produces higher charge carrier mobility. In order to achieve the most orderly arrangement of molecules, the semiconductor must generally be deposited from the vapor phase by vapor sublimation. The vacuum sublimation process, however, requires expensive equipment and lengthy pump-down cycles. But, solution deposition typically does not provide the highly ordered arrangement of molecules required for good charge carrier mobility. The charge carrier mobility of printed electronic devices can therefore be several orders of magnitude lower than that of electronic devices having a vapor deposited semiconductor.

SUMMARY

In view of the foregoing, we recognize that there is a need in the art for printed electronic devices having improved semiconductor performance.

Briefly, in one aspect the present invention provides a method of making an electronic device. The method of making an electronic device comprises solution depositing a dielectric composition onto a substrate and polymerizing the dielectric composition to form a gate dielectric. The dielectric composition comprises a polymerizable resin and zirconium oxide nanoparticles. When a semiconductor layer is solution deposited (for example, ink jet printed) upon the solution deposited gate dielectric of the invention, charge carrier mobilities approaching those which are obtained by vapor deposition of the semiconductor can be observed.

In another aspect, the present invention provides a method of making a thin film transistor. The method of making a thin film transistor comprises (a) solution depositing a gate electrode, (b) solution depositing a dielectric composition, (c) polymerizing the dielectric composition to form a gate dielectric, (d) solution depositing source and drain electrodes, and (d) solution depositing a semiconductor layer. The dielectric composition comprises a radiation polymerizable resin comprising radiation polymerizable monomers, radiation polymerizable oligomers, or a combination thereof, zirconium oxide nanoparticles, and a radiation polymerization initiator.

DETAILED DESCRIPTION

Figure 1:
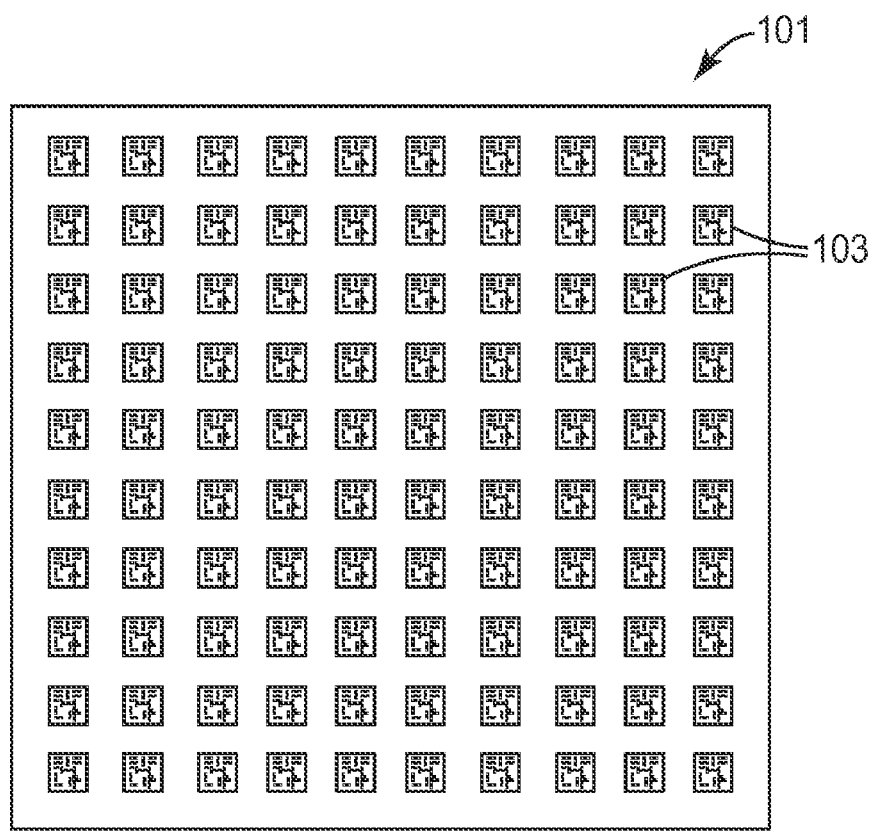
FIG. 1 is a schematic representation of an array of transistors of the Example.

The electronic devices made using the methods of the invention include a solution deposited gate dielectric. The gate dielectric comprises a dielectric material formed by polymerizing a composition comprising a polymerizable resin and zirconium oxide nanoparticles.

The polymerizable resin comprises monomers, oligomers, or a combination thereof. Any polymerizable resin that is compatible with zirconium oxide nanoparticles can be useful in the dielectric material of the invention. As is known by one skilled in the art, different solvent formulation can be used to influence the compatibility of different polymerizable resins with zirconium oxide.

Examples of useful resins include resins having (meth)acrylate or epoxide functionality. As used herein, the term "(meth)acrylate" refers to an acrylate and/or methacrylate. In general, acrylate functionality is preferred over methacrylate functionality; methacrylate functionality is preferred over epoxide functionality, and epoxide functionality is preferred over nonreactive functionality.

Suitable epoxy monomers include, for example, cycloaliphatic diepoxide and bisphenol A diglycidyl ether.

Suitable (meth)acrylate resins include mono (meth)acrylates and multifunctional (meth)acrylates such as di(meth)acrylate, tri(meth)acrylates, tetra(meth)acrylates, and penta (meth)acrylates. Preferably, the resin includes a multifunctional (meth)acrylate.

Examples of useful mono (meth)acrylates include $C_{12}$-$C_{14}$ methacrylates, isodecyl acrylate, 2-(2-ethoxy)ethyl acrylate, tetrahydrofuryl acrylate, caprolactone acrylate, isobornyl acrylate, and epoxy acrylate.

Examples of di(meth)acryl monomers include 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated (10) bisphenol A diacrylate, ethoxylated (3) bisphenol A diacrylate, ethoxylated (30) bisphenol A diacrylate, ethoxylated (4) bisphenol A diacrylate, ethoxylated (4) bisphenol A dimethacrylate, hydroxypivalaldehyde modified trimethylolpropane diacrylate, neopentyl glycol diacrylate, polyethylene glycol (200) diacrylate, polyethylene glycol (400) diacrylate, polyethylene glycol (600) diacrylate, propoxylated neopentyl glycol diacrylate, tetraethylene glycol diacrylate, tricyclodecanedimethanol diacrylate, triethylene glycol diacrylate, tripropylene glycol diacrylate, and the like.

Examples of tri(meth)acryl containing compounds include glycerol triacrylate, trimethylolpropane triacrylate, ethoxylated triacrylates (for example, ethoxylated (3) trimethylolpropane triacrylate, ethoxylated (6) trimethylolpropane triacrylate, ethoxylated (9) trimethylolpropane triacrylate, ethoxylated (15) trimethylolpropane triacrylate, ethoxylated (20) trimethylolpropane triacrylate), pentaerythritol triacrylate, propoxylated triacrylates (for example, propoxylated (3) glyceryl triacrylate, propoxylated (5.5) glyceryl triacrylate, propoxylated (3) trimethylolpropane triacrylate, propoxylated (6) trimethylolpropane triacrylate), trimethylolpropane triacrylate, tris(2-hydroxyethyl)isocyanurate triacrylate, tris-(2-hydroxy ethyl)isocyanurate triacrylate, and the like.

Examples of higher functionality (meth)acryl containing compounds include ditrimethylolpropane tetraacrylate, dipentaerythritol pentaacrylate, ethoxylated (4) pentaerythritol tetraacrylate, pentaerythritol tetraacrylate, caprolactone modified dipentaerythritol hexaacrylate, and the like.

Examples of oligomeric (meth)acryl compounds include urethane acrylates, polyester acrylates, epoxy acrylates, and the like.

Such crosslinking agents are widely available from vendors such as, for example, Sartomer Company, Exton, Pa.; UCB Chemicals Corporation, Smyrna, Ga. and Aldrich Chemical Company, Milwaukee, Wis. Additional useful (meth)acrylate materials include hydantoin moiety-containing poly(meth)acrylates, for example, as described in U.S. Pat. No. 4,262,072 (Wendling et al.).

The dielectric composition of the invention also includes zirconium oxide ("zirconia") nanoparticles dispersed in the polymerizable resin. As used herein, zirconia "nanoparticles" means zirconia particles having at least two dimensions in the 0.1 to 100 nm range. The zirconia nanoparticles preferably have a particle size from about 5 to about 50 nm, or about 5 to about 15 nm, or about 8 nm to about 12 nm. Zirconia dispersions for use in the dielectric compositions of the invention are available, for example, from Nalco Chemical Co. under the trade designation "Nalco OOSSOO8" and from Buhler AG Uzwil, Switzerland under the trade designation "Buhler zirconia Z-WO sol".

The zirconia nanoparticles can be prepared using hydrothermal technology as described in Published U.S. Patent Application No. 2006/0148950, which is incorporated herein by reference. More specifically, a first feedstock that contains a zirconium salt is subjected to a first hydrothermal treatment to form a zirconium-containing intermediate and a byproduct. A second feedstock is prepared by removing at least a portion of the byproduct formed during the first hydrothermal treatment. The second feedstock is then subjected to a second hydrothermal treatment to form a zirconia sol that contains the zirconia particles.

The first feedstock can be prepared by forming an aqueous precursor solution that contains a zirconium salt. The anion of the zirconium salt is usually chosen so that it can be removed during subsequent steps in the process for preparing the zirconia sol. Additionally, the anion is often chosen to be non-corrosive, allowing greater flexibility in the type of material chosen for the processing equipment such as the hydrothermal reactors.

In one method of at least partially removing the anions in the precursor solution, the precursor solution can be heated to vaporize an acidic form of the anion. For example, a carboxylate anion having no more than four carbon atoms can be removed as the corresponding carboxylic acid. More specifically, an acetate anion can be removed as acetic acid. Although the free acetic acid can be removed, at least a portion of the acetic acid is typically adsorbed on the nanoparticle surface. Thus, the nanoparticles typically comprise adsorbed volatile acid.

Preferably, the zirconia nanoparticles are surface modified. Surface modification can help improve compatibility of the zirconia nanoparticles with the resin in order to provide resin compositions with homogeneous components and preferably a relatively low viscosity that can be solution deposited (preferably ink jet printed).

Methods for surface modifying zirconia nanoparticles can be found in WO 2006/073856 and in Published U.S. Patent Application No. 2007/0112097, both of which are incorporated herein by reference.

Various surface treatment agents can be employed. In one aspect, for example, a monocarboxylic acid having a high refractive index can be employed. In another aspect, a monocarboxylic acid can be employed that has a high molecular weight (for example, Mn of at least 200 g/mole) and one or more ethylenically unsaturated groups (for example, that are copolymerizable with the polymerizable resin). In another aspect, at least one dicarboxylic acid can be employed. Each of these monocarboxylic acid surface treatments just described are typically employed in combination with a water soluble (for example, polyether) monocarboxylic acid.

The monocarboxylic acid surface treatments preferably comprise a compatibilizing group. The monocarboxylic acids may be represented by the formula A-B where the A group is a carboxylic acid group capable of attaching to the surface of the nanoparticle, and B is a compatibilizing group that comprises a variety of different functionalities. The carboxylic acid group can be attached to the surface by adsorption and/or formation of an ionic bond. The compatibilizing group B is generally chosen such that it is compatible with the polymerizable resin. The compatibilizing group B can be reactive or nonreactive and can be polar or non-polar.

Compatibilizing groups B that can impart non-polar character to the zirconia particles include, for example, linear or branched aromatic or aliphatic hydrocarbons. Representative examples of non-polar modifying agents having carboxylic acid functionality include octanoic acid, dodecanoic acid, stearic acid, oleic acid, and combinations thereof.

The compatibilizing group B may optionally be reactive such that it can copolymerizable with the polymerizable resin. For instance, free radically polymerizable groups such as (meth)acrylate compatibilizing groups can copolymerize with (meth)acrylate functional organic monomers.

The surface treatment typically comprises at least one monocarboxylic acid (that is, containing one carboxylic acid group per molecule) having a (for example, polyether) water soluble tail. Such surface treatment can impart polar character to the zirconia particles. The polyether tail comprises repeating difunctional alkoxy radicals having the general formula —O—R—. Preferred R groups have the general formula —$C_nH_{2n}$— and include, for example, methylene, ethylene and propylene (including n-propylene and i-propylene) or a combination thereof. Combinations of R groups can be provided, for example, as random, or block type copolymers.

A preferred class of monocarboxylic acids can be represented generally by the following formula:

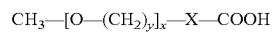

$$CH_3—[O—(CH_2)_y]_x—X—COOH$$

wherein

X is a divalent organic linking group;

x ranges from about 1-10; and y ranges from about 1-4.

Representative examples of X include —$X_2$—$(CH_2)_n$— where $X_2$ is —O— —S—, —C(O)O—, —C(O)NH— and wherein n ranges from about 1-3.

Examples of preferred polyether carboxylic acids include 2-[2-(2-methoxyethoxy)ethoxy]acetic acid having the chemical structure $CH_3O(CH_2CH_2O)_2 CH_2COOH$ (hereafter MEEAA) and 2-(2-methoxyethoxy)acetic acid having the chemical structure $CH_3OCH_2CH_2OCH_2COOH$ (hereafter MEAA). MEAA and MEEAA are commercially from Aldrich Chemical Co., Milwaukee, Wis.

Other surface modifiers with polyether compatibilizing tails can also be usefully employed. Examples of molecules potentially of use are succinic acid mono-[2-(2-methoxyethoxy)-ethyl]ester, maleic acid mono-[2-(2-methoxyethoxy)-ethyl]ester, and glutaric acid mono-[2-(2-methoxyethoxy)-ethyl]ester. These molecules are shown as follows:

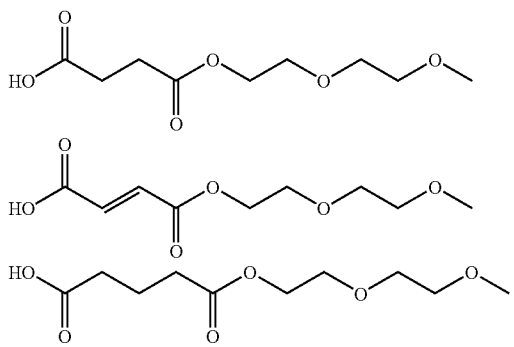

It is also within the scope of this invention to utilize a mixture of more than one polyether carboxylic acid.

A water soluble (for example, polyether) monocarboxylic acid surface treatment can be employed in combination with at least one dicarboxylic acid. The dicarboxylic acid is preferably relatively low in molecular weight. The dicarboxylic acid can be linear or branched. Dicarboxylic acids having up to about 6 carbon atoms between the carboxylic acids groups are preferred. These include, for example, maleic acid, succinic acid, suberic acid, phthalic acid, and itaconic acid.

In other aspects, at least one water soluble (for example, polyether) monocarboxylic acid surface treatment can be employed in combination with a copolymerizable monocarboxylic acid surface treatment having a relatively high molecular weight (for example, higher than beta-carboxy ethyl acrylate (BCEA)). The molecular weight (Mn) of the surface treatments is typically greater than about 200 g/mole. Useful surface treatments generally have a molecular weight of less than about 500 g/mole and preferably less than about 350 g/mole. The copolymerizable monocarboxylic acid further comprises ethylenically unsaturated groups such as (meth)acryl and (meth)acrylate groups. Examples of high molecular weight surface modification agents of this type are succinic acid mono-(2-acryloyloxy-ethyl)ester, maleic acid mono-(2-acryloyloxy-ethyl)ester, and glutaric acid mono-(2-acryloyloxy-ethyl)ester.

Additional compatibilizers can be used to improve various resin and film properties (for example, resin viscosity).

The surface treatment can include yet other surface treatment agents including for example other acids such as other carboxylic acids as well as sulfonic acids, phosphonic acids, alcohols, amines, and titanates.

The surface modification of the particles in the colloidal dispersion can be accomplished in a variety of ways. The process generally involves the mixture of a zirconia particle dispersion with surface modifying agents. Optionally, a co-solvent can be added at this point, such as for example, 1-methoxy-2-propanol, ethanol, isopropanol, ethylene glycol, N,N-dimethylacetamide and 1-methyl-2-pyrrolidinone. The co-solvent can enhance the solubility of the surface modifying agents as well as the surface modified particles. The mixture comprising the zirconia sol and surface modifying agents is subsequently reacted at room or an elevated temperature, with or without mixing.

The surface modified particles can then be incorporated into the curable (that is, polymerizable) resin compositions in various methods. In a preferred aspect, a solvent exchange procedure is utilized whereby the resin is added to the surface modified sol, followed by removal of the water and co-solvent (if used) via evaporation, thus leaving the particles dispersed in the polymerizable resin. The evaporation step can be accomplished for example, via distillation, rotary evaporation or oven drying. In another aspect, the surface modified particles can be extracted into a water immiscible solvent followed by solvent exchange, if so desired. Alternatively, another method for incorporating the surface modified nanoparticles in the polymerizable resin involves the drying of the modified particles into a powder, followed by the addition of the resin material into which the particles are dispersed. The drying step in this method can be accomplished by conventional means suitable for the system, such as, for example, oven drying or spray drying.

The surface modified zirconia nanoparticles can be combined with a polymerizable resin by the various techniques discussed above. Typically, the zirconia particles are present in the polymerizable resin in an amount of about 10 to about 90 weight percent (preferably about 50 to about 80 weight percent). The resulting polymerizable composition can be solution deposited and then polymerized to form a dielectric material that can be used as a gate dielectric.

The polymerizable composition can be deposited onto a substrate using any solution deposition technique. The substrate can be the substrate that supports the entire electronic device (the "device substrate") or another layer or feature of the device. The polymerizable composition can be deposited, for example, by spin coating, dip coating, meniscus coating, gravure coating, or printing techniques such as ink jet printing, flexographic printing, and the like. Preferably, the dispersion is deposited by a printing technique; more preferably by ink jet printing.

The polymerizable composition can be solvent free or can contain solvent. In general, any solvent (for example, organic solvent) that is compatible with the resin can be utilized. The selection of a solvent and the amount employed will depend upon the solution deposition technique to be utilized. The amount of solvent utilized can be used to control the viscosity of the polymerizable composition. Suitable viscosity ranges, however, depend upon the method by which the solution will be deposited because of the wide range of shear rates associated with different methods and will be understood by one of skill in the art.

For ink jet printing, a suitable solvent is typically one that has a low volatility such that the orifices in the printer head do not become clogged due to solvent evaporation. Viscosity and surface tension are also important considerations for ink jet printing. Viscosity and surface tension play important roles, for example, in retention in the ink jet printing head; formation, ejection and delivery of the ink jet droplet; and feature formation and retention on the substrate. In general, a suitable viscosity range for ink jet printing is about 10 to about 30 centipoise (preferably about 10 to about 25 centipoise; more preferably about 10 to about 20 centipoise) as Newtonian fluids at room temperature. Many industrial ink jet print heads have the ability to gently heat the ink and thus decrease its viscosity, allowing for ink formulations with slightly higher viscosities.

Examples of suitable solvents for ink jet printing include 3,5,5-trimethyl-2-cycloexen-1-one(isophorone), butyl benzene, cyclohexanone, cyclopentanone, chlorobenzene, toluene, xylene, and the like.

After the gate dielectric material has been solution deposited onto a substrate, it can be polymerized. Polymerizing or curing can be carried out using heat or by irradiating (for example, by using an ultraviolet (UV) ray or electron beam) the dielectric material. In the case of using an electron beam, the irradiation is typically performed under an inert gas such as nitrogen. The absorbed dose thereto depends on the thickness and composition of the dielectric material layer and is usually from about 1 to about 100 kGy. If an UV ray is used, the irradiation energy of the dielectric material layer is usually from about 10 to about 300 mJ/cm$^2$ (preferably, from about 20 to about 150 mJ/cm$^2$). Preferably, the gate dielectric material is polymerized via a free-radical photopolymerization mechanism.

Typically, the gate dielectric material is polymerized in the presence of a polymerization initiator. The polymerization initiator is not specifically limited. Thermally activated initiators including azobis compounds (such as 2,2'-azobisisobutyronitrile (Vazo™ 64, AIBN), 2,2'-azobis(2-methylbutyronitrile) (Vazo™ 67) or 2,2'-azobis(2,4-dimethylvaleronitrile) (Vazo™ 52) or a peroxide compound (such as benzoyl peroxide or lauroyl peroxide) can be used. Preferably, the polymerization initiator is a radiation polymerization initiator. UV photoinitiators such as 1-hydroxycyclohexyl-phenyl ketone (Irgacure™ 184), 2-hydroxy-2-methyl-1-phenyl-1-propanone (Darocur™ 1173), α,α-dimethoxy-α-phenylacetophenone (Irgacure™ 651), or phenyl bis(2,4,6-trimethylbenzoyl)phosphine oxide (Irgacure™ 819) can be used. Preferably, the polymerization initiator is used in the amount within a range from about 0.1% to about 3% by weight based on the total weight of the monomer/oligomers component.

The properties of the resulting cured dielectric material layer can vary and will be dictated in part by the substrate and adjacent layers employed, as well as the intended application. Because multilayered electronic devices can exhibit large interfacial stresses when subjected to changes in temperature, it is typically desirable to formulate the dielectric material such that it has a coefficient of thermal expansion compatible with the adjacent device layers. Additionally, the dielectric material layer should be formulated for compatibility with the nature of the end application in mind. For example, if the electronic device is to be a "flexible" device, the layer should have some ability to endure the requirements of the flexible device without cracking. The material must also have sufficient film forming properties such that it does not flow or permanently deform as a result of being subjected to normal operating temperatures. It can therefore be desirable for the material to have a glass transition temperature (Tg) near the top of the devices normal operating temperature range (for example, at about 60° C. for an organic thin film transistor).

The dielectric layer can be patterned, for example, using ink jet printing or masking techniques. To pattern using masking techniques, a dielectric layer can be deposited as described above. Then, the layer can be patterned by exposing predetermined regions of the layer to UV light through a photomask, which permits the light to pass only in accordance with the desired pattern. Only the regions that are exposed to the light will cure. The uncured regions can then be removed (for example, with solvents).

The solution deposited gate dielectric of the invention is useful in various types of electronic devices including, for example, capacitors, transistors (for example, junction transistors or thin film transistors), diodes (for example, light emitting diodes), photovoltaics, sensors, solar cells, and displays. The remaining features and layers of the electronic device can be fabricated using any useful methods. Preferably, the remaining features and layers are solution deposited. More preferably, the remaining features and layers are ink jet printed.

Thin film transistors (TFTs) are a particularly useful type of electronic device. TFTs generally include a transistor substrate, a gate electrode on the transistor substrate, a gate dielectric on the gate electrode, a source and a drain electrode adjacent to the gate dielectric, and a semiconductor layer adjacent to the gate dielectric and adjacent to the source and drain electrodes. These components can be assembled in a variety of configurations. For example, the source and drain electrodes can be adjacent to the gate dielectric with the semiconductor layer over the source and drain electrodes, or the semiconductor layer can be interposed between the source and drain electrodes and the gate dielectric. More specifically, a TFT can be configured as (1) a bottom gate, bottom contact TFT, (2) a top gate, top contact TFT, (3) bottom gate, top contact TFT, or (4) a top gate, bottom contact TFT.

Figure 3A:
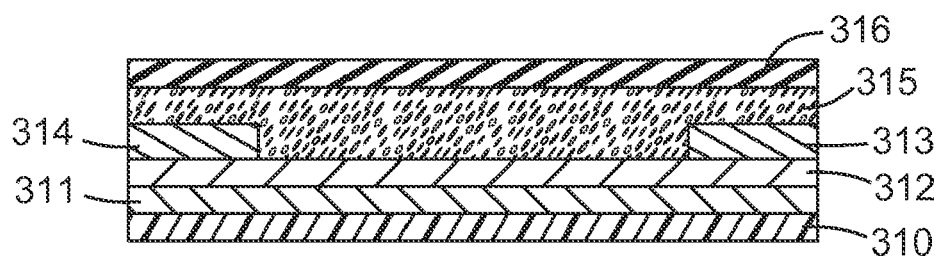
FIGS. 3A-3D are cross sectional views of thin film transistors.

FIG. 3A illustrates a bottom gate, bottom contact TFT. Gate electrode 311 is disposed on a transistor substrate 310. Dielectric layer 312 is disposed on gate electrode 311. Patterned source and drain electrodes 313, 314 are disposed on dielectric layer 312. Semiconductor layer 315 is disposed on source and drain electrodes 313, 314 and dielectric layer 312. Optionally, an encapsulant layer 316 can be disposed on semiconductor layer 315.

Figure 3B:
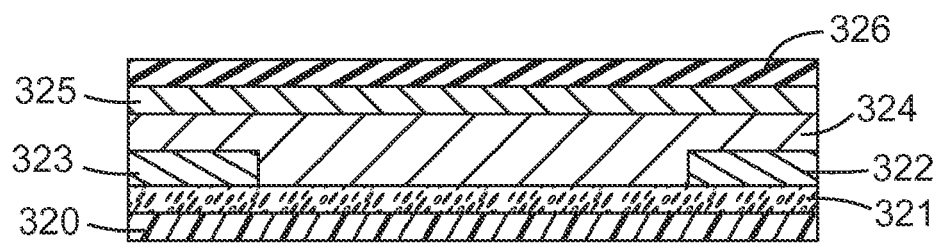

FIG. 3B illustrates a top gate, top contact TFT. Semiconductor layer 321 is disposed on a transistor substrate 320. Patterned source and drain electrodes 322, 323 are disposed on semiconductor layer 321. Dielectric layer 324 is disposed on source and drain electrodes 322, 323 and semiconductor layer 321. Gate electrode 325 is disposed on dielectric layer 324, and optional encapsulant layer 326 is disposed on gate electrode 325.

Figure 3C:
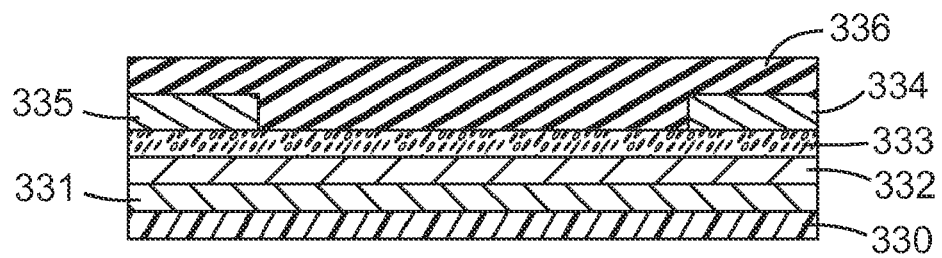

FIG. 3C illustrates a bottom gate, top contact TFT. Gate electrode 331 is disposed on a transistor substrate 330. Dielectric layer 332 is disposed on gate electrode 331. Semiconductor layer 333 is disposed on dielectric layer 332. Patterned source and drain electrodes 334, 335 are disposed on semiconductor layer 333. Optional encapsulant layer 336 is disposed on source and drain electrodes 334, 335 and semiconductor layer 333.

Figure 3D:
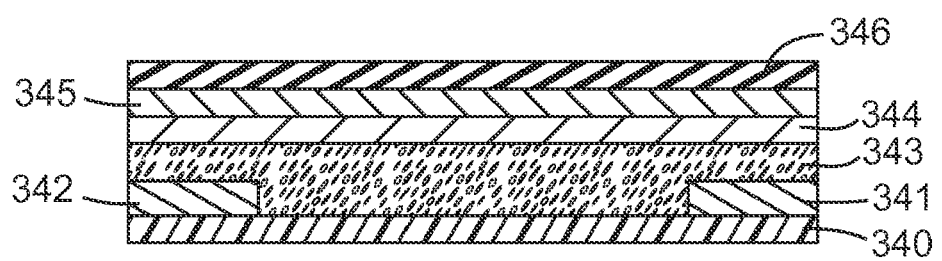

FIG. 3D illustrates a top gate, bottom contact TFT. Patterned source and drain electrodes 341, 342 are disposed on a transistor substrate 340. Semiconductor layer 343 is disposed on source and drain electrodes 341, 342 and substrate 340. Dielectric layer 344 is disposed on semiconductor layer 343. Gate electrode 345 is disposed on dielectric layer 344. Optional encapsulant layer 346 is disposed on gate electrode 345.

The present invention provides a method of making TFTs comprising the gate dielectric of the invention. TFTs made according to the present invention can be provided on a substrate (the "transistor substrate"). The transistor substrate typically supports the TFT during manufacturing, testing, and/or use. For example, one transistor substrate may be selected for testing or screening various embodiments while another transistor substrate is selected for commercial embodiments. Optionally, the transistor substrate can provide an electrical function for the TFT. Useful transistor substrate materials include organic and inorganic materials. For example, the transistor substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalate) (PEN), poly(ethylene terephthalate) (PET), poly(phenylene sulfide) (PPS)), filled polymeric materials (for example, fiber-reinforced plastics (FRP)), fibrous materials, such as paper and textiles, and coated or uncoated metallic foils. Preferably, the transistor substrate comprises a polymeric material. More preferably the transistor substrate comprises PET or PEN.

A flexible transistor substrate can be used with the present invention. A flexible transistor substrate allows for roll processing, which may be continuous, providing economy of scale and economy of manufacturing over flat and/or rigid substrates. The flexible transistor substrate chosen preferably is capable of wrapping around the circumference of a cylinder of less than about 50 cm diameter (preferably, less than about 25 cm diameter; more preferably, less than about 10; most preferably, less than about 5 cm) without distorting or breaking. The force used to wrap the flexible transistor substrate of the invention around a particular cylinder typically is low, such as by unassisted hand (that is, without the aid of levers, machines, hydraulics, and the like). The preferred flexible transistor substrate can be rolled upon itself.

The gate electrode of a TFT can be any useful conductive material. For example, the gate electrode can comprise doped silicon, or a metal, such as aluminum, copper, chromium, gold, silver, nickel, palladium, platinum, tantalum, and titanium, and transparent conducting oxides such as indium tin oxide or a doped zinc oxide (for example, aluminum doped zinc oxide or gallium doped zinc oxide).

Conductive polymers also can be used, for example polyaniline or poly (3,4-ethylenedioxythiophene)/poly(styrene sulfonate) (PEDOT:PSS). In addition, alloys, combinations, and multilayers of these materials can be useful. In some TFTs, the same material can provide the gate electrode function and also provide the support function of a transistor substrate. For example, doped silicon can function as the gate electrode and support the TFT.

The gate dielectric electrically insulates the gate electrode from the balance of the TFT device. The gate dielectric preferably has a relative dielectric constant above about 2 (more preferably, above about 5). The dielectric materials formed by polymerizing a composition comprising a polymerizable resin and zirconia nanoparticles described above are useful at the gate dielectric of a TFT.

The source electrode and drain electrodes of a TFT are separated from the gate electrode by the gate dielectric, while the semiconductor layer can be over or under the source electrode and drain electrode. The source and drain electrodes can be any useful conductive material. Useful materials include most of those materials described above for the gate electrode, for example, aluminum, barium, chromium, copper, gold, silver, nickel, palladium, platinum, titanium, transparent conducting oxides such as indium tin oxide or a doped zinc oxide (for example, aluminum doped zinc oxide or gallium doped zinc oxide), polyaniline, PEDOT:PSS, other conducting polymers, alloys thereof, combinations thereof, and multilayers thereof.

The thin film electrodes (that is, the gate electrode, source electrode, and drain electrode) can be provided by any useful means such as, for example, by plating, ink jet printing, or vapor deposition (for example, thermal evaporation or sputtering). Preferably, the thin film electrodes are provided by ink jet printing. Patterning of the thin film electrodes can be accomplished by known methods such as aperture masking, additive photolithography, subtractive photolithography, printing, microcontact printing, and pattern coating. The gate dielectric can be provided by any useful solution deposition technique. Preferably, the gate dielectric is provided by ink jet printing.

The semiconductor layer can comprise organic or inorganic semiconductor materials. Useful inorganic semiconductor materials include amorphous silicon, cadmium sulfide, cadmium selenide, and tellurium. Preferably, the semiconductor material is an organic semiconductor material. Useful organic semiconductor materials include acenes and substituted derivatives thereof. Particular examples of acenes include anthracene, naphthalene, tetracene, pentacene, and substituted pentacenes. Other examples include semiconducting polymers, perylenes, fullerenes, phthalocyanines, oligothiophenes, polythiophenes, polyphenylvinylenes, polyacetylenes, metallophthalocyanines and substituted derivatives. Useful bis-(2-acenyl)acetylene semiconductor materials are described in U.S. Pat. No. 7,109,519 (Gerlach), which is herein incorporated by reference. Useful acene-thiophene semiconductor materials are described in U.S. Pat. No. 6,998,068 (Gerlach), which is herein incorporated by reference.

Substituted derivatives of acenes include acenes substituted with at least one electron-donating group, halogen atom, or a combination thereof, or a benzo-annellated acene or polybenzo-annellated acene, which optionally is substituted with at least one electron-donating group, halogen atom, or a combination thereof The electron-donating group is selected from an alkyl, alkoxy, or thioalkoxy group having from 1 to 24 carbon atoms. Preferred examples of alkyl groups are methyl, ethyl, n-propyl, isopropyl, n-butyl, sec-butyl, n-pentyl, n-hexyl, n-heptyl, 2-methylhexyl, 2-ethylhexyl, n-octyl, n-nonyl, n-decyl, n-dodecyl, n-octadecyl, and 3,5,5-trimethylhexyl. Substituted pentacenes and methods of making them are taught in U.S. Pat. No. 6,974,877 (Vogel et al.) and U.S. Pat. No. 6,864,396 (Smith et al.), which are herein incorporated by reference.

Further details of benzo-annellated and polybenzo-annellated acenes can be found in the art, for example, in National Institute of Standards and Technology (NIST) Special Publication 922 "Polycyclic Aromatic Hydrocarbon Structure Index," U.S. Govt. Printing Office, by Sander and Wise (1997).

Preferably, the semiconductor material is one that can be solution deposited. Examples of suitable semiconductor materials that can be solution deposited include

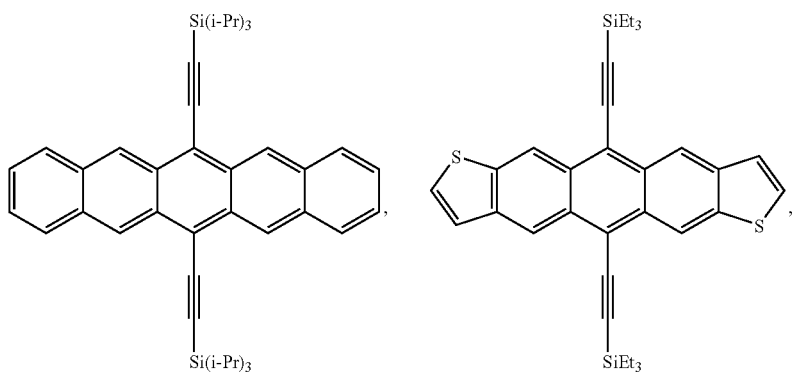

6,13-bis(triisopropylsilylethynyl)pentacene (TIPS pentacene)

TES-Anthracenedithiophene

-continued
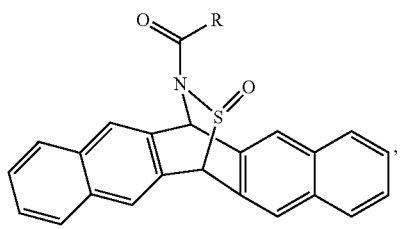
Pentacene Precursor
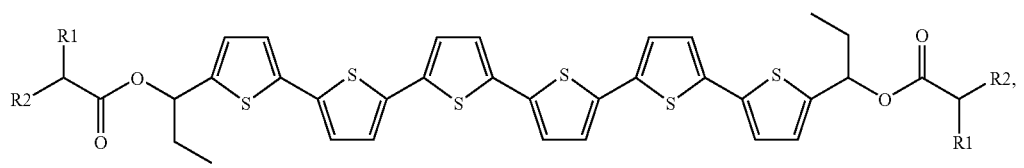
Polythiophene Precursor
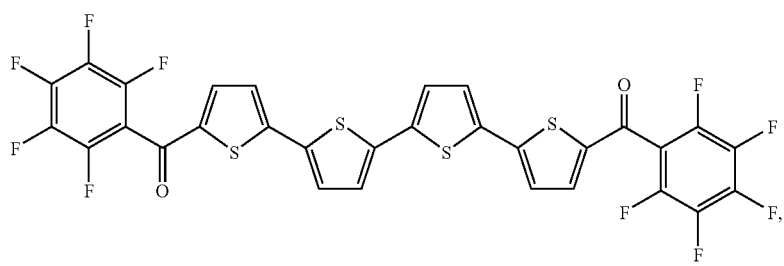
DFHCO-4T
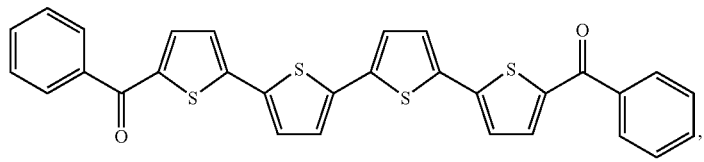
DHCO-4T
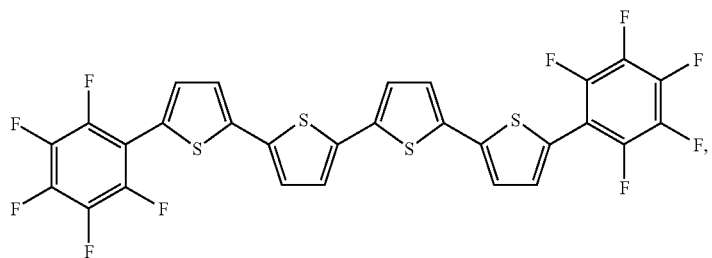
DFB-4T
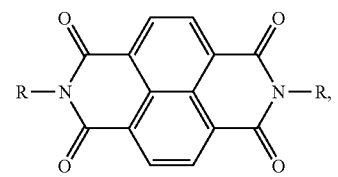
Naphthalenetetracarboxylic diimide
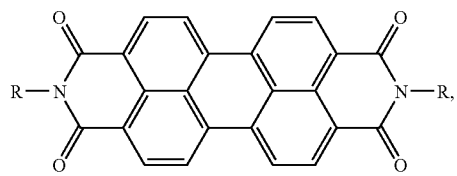
Perylenetetracarboxylic diimide
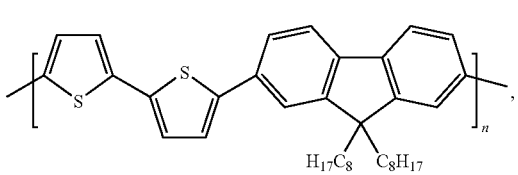
Poly(9,9'-dioctylfluorene-co-dithiophene)

-continued

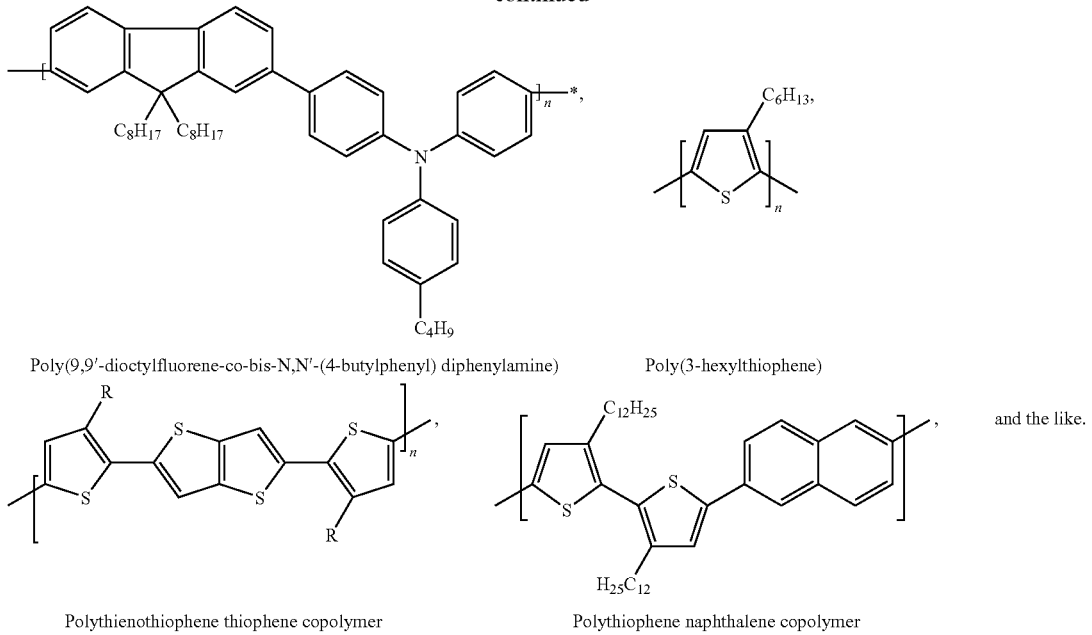

Poly(9,9'-dioctylfluorene-co-bis-N,N'-(4-butylphenyl) diphenylamine)

Poly(3-hexylthiophene)

Polythienothiophene thiophene copolymer

Polythiophene naphthalene copolymer and the like.

Preferably, the semiconductor layer comprises TIPS pentacene.

Optionally, the semiconductor layer can include a polymeric additive. Surprisingly, the polymeric additive does not interfere with the packing/alignment of the semiconductor molecules. Useful additives include polymers having a molecular weight between about 1,000 and about 500,000 g/mol (preferably, between about 50,000 and about 200,000 g/mol). Examples of useful polymeric additives include those described in U.S. Pat. No. 7,098,525 (Bai et al.) and WO 2005/055248, which are herein incorporated by reference. Specific examples include polystyrene, poly(alpha-methylstyrene), polymethylmethacrylate, poly(4-cyanomethyl styrene), poly(4-vinylphenol), and the like.

The semiconductor layer can be provided by any useful means such as, for example, solution deposition, spin coating, printing techniques, or vapor deposition (preferably, by solution deposition; more preferably, by ink jet printing). Patterning of the semiconductor layer can be accomplished by known methods such as aperture masking, additive photolithography, subtractive photolithography, printing, microcontact printing, and pattern coating (preferably, by printing).

The method of the present invention enables the fabrication of TFTs formed by solution depositing (for example, ink jet printing) the transistor layers (preferably, all of the transistor layers). The solution deposited TFT exhibit mobilities approaching those of TFTs with vapor deposited semiconductors.

A plurality of TFTs can be interconnected to form an integrated circuit (IC). Integrated circuits include but are not limited to, for example, ring oscillators, radio-frequency identification (RFID) circuitry, logic elements, amplifiers, and clocks. Therefore, TFTs of the present invention can be interconnected to other TFTs by means known in the art to form ICs. TFTs of the invention can also be used in various electronic articles such as, for example, RFID tags, backplanes for displays (for use in, for example, personal computers, cell phones, or handheld devices), smart cards, memory devices, and the like.

An array of TFTs comprising at least of one TFT made according to the invention can also be made. A 10×10 array of TFTs can be made, for example, by simultaneously depositing the various transistor layers and features for each TFT onto a transistor substrate in sequence.

EXAMPLES

Objects and advantages of this invention are further illustrated by the following examples, but the particular materials and amounts thereof recited in these examples, as well as other conditions and details, should not be construed to unduly limit this invention.

Materials

Substrate

Poly(ethylene naphthalate) (PEN) film (500 gauge), obtained from DuPont/Tejin Films as TEONEX Q65FA, was used as the substrate. The film has a slip agent incorporated on one surface, therefore all printing was performed on the untreated surface.

Conductor Ink—Used for Source, Drain, and Gate Electrodes

Nano-particulate silver (Ag) based ink for ink-jet delivery, AG-IJ-G-100-SI Silver Conductor Ink, available from Cabot Corporation, Haverhill, Mass., was used to form the conductive layers.

Preparatory Example 1

Dielectric Ink

The ink used to produce the dielectric layer via ink-jet deposition was prepared as follows:

Nanoparticulate zirconia, surface modified with 3-(methacryloxypropyl)trimethoxysilane), was prepared as described in Example 2 of WO 2006/073856 (Walker et al.).

To 146 grams of the zirconia nanoparticle dispersion was added 8.5 grams of tris(2-hydroxyethyl)isocyanurate triacrylate (available from Sartomer as SR-368), 1.5 grams 1-hydroxycyclohexylphenyl ketone (available as Irgacure™ 184 from Ciba Specialty Chemicals), and 50 grams of 3,5,5-trimethyl-2-cyclohexen-1-one (available from Alpha Aesar, Ward Hill, Mass.). The combined materials were mixed via magnetic stirring. The resulting dispersion was subjected to rotary evaporation (Buchi Rotavapor R-205) using a bath temperature of 65° C. and vacuum (6 mm Hg (800 Pa)) to ensure preferential removal of the 1-methoxypropan-2-ol byproduct. The resulting mixture was 50 wt % solids and 40 wt % $ZrO_2$. The mixture was allowed to cool to room temperature and was then filtered through a 1.0 um filter into a clean amber glass bottle.

Preparatory Example 2

Polymeric Additive Stock Solution

A stock solution of poly(styrene) was prepared by combining 1.00 grams of poly(styrene) (118,000 $M_w$; $M_n/M_w$=1.05) (available as #P3915-S from Polymer Source, Inc., Albuquerque, N. Mex.) and 19.00 grams of butylbenzene (Aldrich, Milwaukee, Wis.) in a clean glass container. The container was capped and placed on a laboratory shaker until the polymer completely dissolved.

Preparatory Example 3

Semiconductor Ink

Semiconductor ink was prepared by weighing 500 milligrams 6,13-bis(triisopropylsilylethynyl)pentacene (TIPS-Pentacene), (Example 1 of U.S. Pat. No. 6,690,029 (Anthony et al.)), into a clean glass container. 5.00 grams of the Polymeric Additive Stock Solution was added to the container and 19.50 grams of butylbenzene (Aldrich) was added to the container. The container was capped and placed on a laboratory shaker overnight. The solution was then placed in a syringe fitted with a syringe filter (0.2 um, poly(tetrafluoroethylene), PTFE) and filtered into a clean amber glass vial and capped.

Example

Ink Jet Printed Array of Transistors

Figure 2:
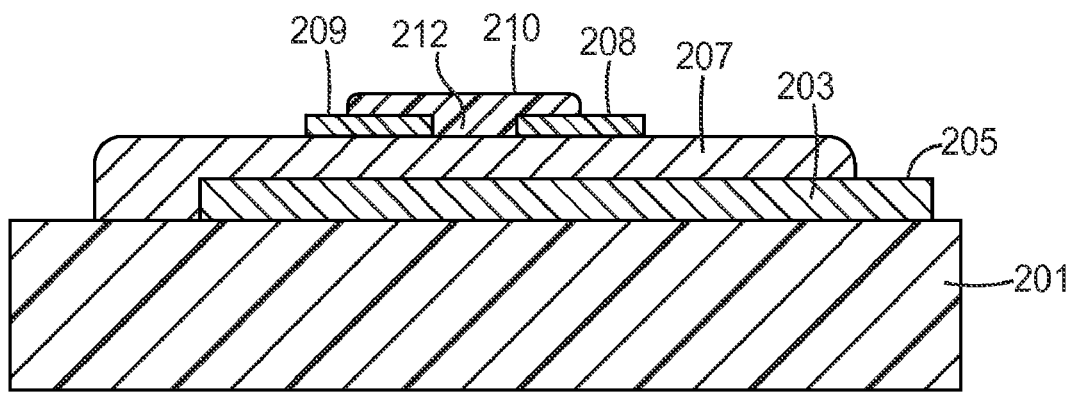
FIG. 2 is a schematic representation of a transistor of the array of transistors of the Example.

A 10×10 array of transistors as depicted in array 101 of FIG. 1 (including a total of one hundred transistors 103) was produced by ink-jet printing. An enlarged diagram of one transistor 103 of the array is shown in FIG. 2. Even though all of the components of the transistors in the array were printed at the same time, the reference numbers in the following description are that of any one of the transistors.

A (15×16.25 cm) rectangular piece of substrate film 201, was held down by vacuum and pre-heated by passing under an infrared (IR) Lamp (Research Incorporated, Line IR 5194-04, 4 inch, 2000 Watt (500 W/in.) infrared lamp powered by a Research Incorporated 5420 power controller) using 8 passes at a speed of 5 cm/sec and 100% power.

An array of gate electrodes 203 (1 mm×1 mm with attached probe pads (205)) was ink-jet printed onto the PEN substrate 201 using the Conductor Ink. The Conductor Ink layer was then subjected to heating with the IR lamp to aide the removal of solvent (14 passes, 2.5 cm/sec, 100% power) and then was further heated with the IR lamp (5 passes, 2.5 cm/sec, 100% power) to consolidate the Ag nanoparticles into a conductive film with low resistivity ($2.75\times10^{-5}$ ohms/cm). The device was allowed to cool to room temperature.

The Dielectric Ink was printed atop the gate electrodes 203 so as to cover the gate electrodes 203 while leaving the probe pads 205 exposed for electrical contact necessary during device characterization testing. Solvent was removed by heating with the IR lamp (10 passes, 5 cm/sec., 40% power). The resulting layer was cured by exposure to the output of a UV curing system (two 15 watt lamps placed approximately 5 cm from the layer surface within a three-sided metallized reflector enclosure with a nitrogen purge) (8 passes, 0.5 cm/sec., 100% power). Upon completion of the UV cure the dielectric layers of the array 207 were subjected to a post-cure thermal treatment with the IR Lamp (12 passes, 1 in./sec., 100% power).

Source 208 and drain 209 electrodes of each transistor were then printed with Conductive Ink atop the dielectric layers 207 in registration with the previously printed gate electrodes 203 so as to form the "channels" 212 of the transistors of the array. The Conductive Ink defining the source 208 and drain 209 electrodes was consolidated, made conductive, by exposure to the IR Lamp (15 passes, 2.5 cm/sec, 100% power). Transistor channels 212 were generated during this step, having either a channel length (the length of the gap between the source and drain electrodes) of 22 micrometers or 220 micrometers. The surface of the 10×10 array was then treated by placing a layer of toluene over the device for one minute followed by drying in a nitrogen stream.

Semiconductor Ink was inkjet printed to form semiconductors 210 in a pattern so as to entirely cover the channel region 212 of each transistor without contacting the semiconductor 210 of any adjacent transistor. The Semiconductor Ink was allowed to dry by unaided evaporation of the solvent in air for 30 minutes.

Testing and Characterization

Transistor performance was tested at room temperature in air using a Semiconductor Parameter Analyzer (Model 4145A from Hewlett-Packard, Palo Alto, Calif.). The square root of the drain current ($I_d$) was plotted as a function of gate-source bias ($V_g$), from +10 V to −40 V for a constant source-drain bias ($V_{DS}$) of −40 V for the device. Using the following equation:

$$I_d = \mu C \frac{W}{L} \frac{(V_g - V_t)^2}{2}$$

The saturation field effect mobility was calculated from the linear portion of the curve using the specific capacitance of the gate dielectric (C), the measured channel width (W) and channel length (L). The x-axis extrapolation of this straight-line fit was taken as the threshold voltage ($V_{th}$). In addition, plotting Id as a function of $V_g$ yielded a curve where a straight line fit was drawn along a portion of the curve containing $V_t$. The inverse of the slope of this line was taken as the Sub-threshold slope (S). The On/Off ratio was taken as the ratio of the maximum drain current and minimum drain current ($I_d$) values of the $I_d$-$V_g$ curve.

The device characteristics determined from a transistor 103 (having a 22 micrometer channel length) of array 101 is summarized in Table I.

TABLE I

| Transistor Performance Characteristics | | |
|---|---|---|
| Parameter | Value | Units |
| Mobility | 0.191 | cm$^2$/V-sec |
| On/Off Ratio | 9.09 × 10$^3$ | |
| Threshold Voltage | −1.321 | V |
| Sub-threshold Slope | 1.67 | V/decade |

The results in Table I demonstrate a functioning transistor. Other devices (transistors 103) of the array 101 were found to have comparable performance characteristics.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A method of making an electronic device comprising:
   (a) solution depositing a dielectric composition onto a substrate, the dielectric composition comprising an ultraviolet radiation polymerizable resin comprising tris-(2-hydroxy ethyl) isocyanurate triacrylate, an ultraviolet photoinitiator, and zirconium oxide nanoparticles; and
   (b) polymerizing the dielectric composition via at least ultraviolet radiation to form a gate dielectric.

2. The method of claim 1 wherein the zirconium oxide nanoparticles are surface modified.

3. The method of claim 1 wherein the dielectric composition further comprises a solvent.

4. The method of claim 1 wherein the dielectric composition has a viscosity of about 10 to about 30 centipoise.

5. The method of claim 1 wherein the dielectric composition is ink jet printed onto the substrate.

6. The method of claim 1 further comprising solution depositing a semiconductor onto the gate dielectric.

7. The method of claim 6 wherein the semiconductor is ink-jet printed onto the gate dielectric.

8. The method of claim 6 wherein the semiconductor is an organic semiconductor.

9. The method of claim 6 wherein the semiconductor layer comprises a polymeric additive.

10. The method of claim 8 wherein the semiconductor comprises 6,13-bis(triisopropylsilylethynyl)pentacene.

11. A method of making a thin film transistor comprising:
    (a) solution depositing a gate electrode;
    (b) solution depositing a dielectric composition, the dielectric composition comprising (i) an ultraviolet radiation polymerizable resin comprising tris-(2-hydroxy ethyl) isocyanurate triacrylate, (ii) zirconium oxide nanoparticles, and (iii) an ultraviolet photoinitiator;
    (c) polymerizing the dielectric composition via at least ultraviolet radiation to form a gate dielectric;
    (d) solution depositing source and drain electrodes; and
    (e) solution depositing a semiconductor layer.

12. The method of claim 11 further comprising providing a transistor substrate, wherein the gate electrode is deposited on the transistor substrate, the dielectric composition is deposited on the gate electrode, the source and drain electrodes are deposited on the gate dielectric, and the semiconductor layer is deposited adjacent to the gate dielectric and adjacent to the source and drain electrodes.

13. The method of claim 11 further comprising providing a transistor substrate, wherein the semiconductor layer is deposited on the transistor substrate, the source and drain electrodes are deposited on the semiconductor layer, the dielectric material is deposited adjacent to the source and drain electrodes and adjacent to the semiconductor layer, and the gate electrode is deposited on the gate dielectric.

14. The method of claim 11 further comprising providing a transistor substrate, wherein the gate electrode is deposited on the transistor substrate, the dielectric material is deposited on the gate electrode, the semiconductor layer is deposited on the gate dielectric, and the source and drain electrodes are deposited on the semiconductor layer.

15. The method of claim 11 further comprising providing a transistor substrate, wherein the source and drain electrodes are deposited on the transistor substrate, the semiconductor layer is deposited adjacent to the source and drain electrodes and adjacent to the transistor substrate, the dielectric material is deposited on the semiconductor layer, and the gate electrode is deposited on the gate dielectric.

16. The method of claim 11 wherein the gate electrode, gate dielectric, source and drain electrodes, and semiconductor layer are ink jet printed.

17. The method of claim 16 wherein the zirconium oxide nanoparticles are surface modified.

18. The method of claim 11 wherein the thin film transistor is roll processed.

* * * * *

UNITED STATES PATENT AND TRADEMARK OFFICE
CERTIFICATE OF CORRECTION

| | | |
|---|---|---|
| PATENT NO. | : 7,879,688 B2 | Page 1 of 1 |
| APPLICATION NO. | : 11/771787 | |
| DATED | : February 1, 2011 | |
| INVENTOR(S) | : James C Novack | |

It is certified that error appears in the above-identified patent and that said Letters Patent is hereby corrected as shown below:

Page 2, Column 2 (Other Publication), Line 1 – Delete "Transistion" and insert -- Transition --, therefor.

Column 6, Line 58 – Delete "cycloexen" and insert -- cyclohexen --, therefor.

Column 10, Line 29 – Delete "thereof The" and insert -- thereof. The --, therefor.

Column 14, Line 49 – Delete "Tejin" and insert -- Teijin --, therefor.

Column 15, Line 22 – Delete "$M_w/M_w$" and insert -- $M_w/M_n$ --, therefor.

Column 17, Line 40 – In Claim 5, delete "ink jet" and insert -- ink-jet --, therefor.

Column 18, Line 44 – In Claim 17, delete "claim 16" and insert -- claim 11 --, therefor.

Signed and Sealed this

Nineteenth Day of April, 2011

David J. Kappos
*Director of the United States Patent and Trademark Office*